United States Patent [19]
Makino et al.

[11] Patent Number: 6,031,778
[45] Date of Patent: Feb. 29, 2000

[54] SEMICONDUCTOR INTEGRATED CIRCUIT

[75] Inventors: Hiroshi Makino; Hiroaki Suzuki, both of Tokyo, Japan

[73] Assignee: Mitsubishi Denki Kabushiki Kaisha, Tokyo, Japan

[21] Appl. No.: 08/899,306

[22] Filed: Jul. 23, 1997

[30] Foreign Application Priority Data

Mar. 19, 1997 [JP] Japan ..................... 9-066973

[51] Int. Cl.[7] .................................. G11C 7/00
[52] U.S. Cl. .................. 365/226; 365/189.11; 327/530; 327/534; 327/537
[58] Field of Search ................. 365/226, 189.11, 365/185.27; 327/530, 534, 537

[56] References Cited

U.S. PATENT DOCUMENTS

| 5,020,029 | 5/1991 | Ichinose et al. | 365/154 |
| 5,406,524 | 4/1995 | Kawamura et al. | 365/185.27 |
| 5,461,338 | 10/1995 | Hirayama et al. | 327/534 |
| 5,610,533 | 3/1997 | Arimoto et al. | 365/226 |
| 5,646,900 | 7/1997 | Tsukude et al. | 365/205 |
| 5,828,611 | 10/1998 | Kaneko et al. | 365/226 |

FOREIGN PATENT DOCUMENTS

| 5-108194 | 4/1993 | Japan . |
| 7-212217 | 8/1995 | Japan . |
| 7-212218 | 8/1995 | Japan . |
| 7-296587 | 11/1995 | Japan . |

*Primary Examiner*—David Nelms
*Assistant Examiner*—VanThu Nguyen
*Attorney, Agent, or Firm*—Burns, Doane, Swecker & Mathis, LLP

[57] ABSTRACT

A semiconductor integrated circuit capable of eliminating a problem of a conventional semiconductor integrated circuit in that although a power saving mode can be applied normally to a combination circuit, it cannot be applied to a sequential circuit because the sequential circuit operates abnormally in the power saving mode, eliminating its holding data, in the conventional semiconductor integrated circuit. The semiconductor integrated circuit has a controller for varying the threshold voltages of field effect transistors included in the sequential circuit so that the controller places the threshold voltages at a low level in an operating mode to speed up the data write and read, and places them at a high level in an idling mode to reduce leakage currents. This makes it possible to prevent the data held in the sequential circuit from being corrupted and eliminated, and to implement a low power consumption.

20 Claims, 7 Drawing Sheets

SEMICONDUCTOR INTEGRATED CIRCUIT

BACKGROUND OF THE INVENTION

1. Field of the Invention

The present invention relates to a semiconductor integrated circuit with low power consumption applicable to portable electronic equipment or the like to prolong the lifetime of its battery.

2. Description of Related Art

As the portable equipment has been advancing and developing recently, large-scale integration (LSI) circuits of lower power consumption are required to prolong the lifetime of the battery loaded onto the equipment. One of effective techniques to reduce the consumed power is to drop the operating voltage. Since the consumed power is the product of voltage and current, the operating voltage reduction can decrease both voltage and current. Thus, this is generally thought to give a square effect.

However, MOSFETs constituting the LSI have a characteristic that their operating speed falls as their supply voltage drops. The characteristic is due to the fact that their threshold voltage cannot be imprudently lowered even if the supply voltage is dropped. This is because reducing the threshold voltage will increase the leakage current of the MOSFETs in the nonconducting state, which will increase the consumed power instead of saving power. To solve such a problem, the following conventional methods are taken.

FIG. 7 shows a circuit operating at a low voltage employing so-called MT-CMOS (Multi-threshold CMOS), which is disclosed in Japanese patent application laid-open No. 7-212218/1995. In this figure, the reference numerals 1, 2 and 5 each designate a p-channel MOSFET, and 3, 4 and 6 each designate an n-channel MOSFET. The absolute value of the threshold voltage of the p-channel MOSFETs 1 and 2 are set lower than that of the p-channel MOSFET 5, and the absolute value of the threshold voltage of the n-channel MOSFETs 3 and 4 are set lower than that of the n-channel MOSFET 6 (in the following description, the term "threshold voltage" refers to its absolute value). The MOSFETs 1–4 constitute a combination circuit 11, a two input NAND gate. The p-channel MOSFET 5 is connected across a supply voltage 12 and a virtual power supply line 9 with its gate receiving a control signal CSB1, and the n-channel MOSFET 6 is connected across a ground line 10 and a ground 13 with its gate receiving a control signal CS1.

Next, the operation will be described.

To operate the combination circuit 11 consisting of the two input NAND gate, the control signal CS1 is placed at a high level, and its inverted signal, the control signal CSB1 is placed at a low level. Thus, both the p-channel MOSFET 5 and n-channel MOSFET 6 conduct, so that the virtual power supply line 9 is pulled up to a voltage $V_{DD}$ of the supply voltage 12, and the ground line 10 is pulled down to the voltage $V_{GND}$ of the ground voltage 13. As a result, the combination circuit 11 performs the normal NAND operation. In this case, since the threshold voltages (absolute value) of the MOSFETs 1–4 have been set low, high speed operation is achieved even if the voltage $V_{DD}$ of the supply voltage 12 is low.

On the other hand, when the combination circuit 11 is idling (sleeping), the control signal CS1 is placed at the low level, and its inverted signal, the control signal CSB1 is placed at the high level. This will cause both the p-channel MOSFET 5 and n-channel MOSFET 6 to be placed at a nonconducting state so that the virtual power supply line 9 and ground line 10 are disconnected from the supply voltage 12 and ground 13, respectively. In this case, since the threshold voltages (absolute value) of the p-channel MOSFET 5 and n-channel MOSFET 6 have been set higher than those of the MOSFET 1–4, the leakage current is suppressed at a small value.

Generally speaking, the leakage current across the source and drain increases exponentially against the gate voltage in the region in which the gate-source voltage of a MOSFET is lower than the threshold voltage. Accordingly, the leakage current can be greatly reduced during idling of the combination circuit 11 by setting the threshold voltages of the MOSFETs 5 and 6 at values different from those of the MOSFETs 1–4. Although the foregoing description is provided when the combination circuit 11 is a two input NAND gate, a similar discussion holds true for all LSIs of any types and scales.

Although the conventional low operating voltage semiconductor integrated circuit thus constructed operates normally when it is applied to a combination circuit like the two input NAND circuit, in which its output is determined by a combination of its inputs, it has a problem in that it operates erroneously when applied to a sequential circuit having a function of holding a previous state.

FIG. 8 shows a latch circuit as an example of the sequential circuit, in which two inverters have their inputs and outputs cross-connected. In FIG. 8, the reference numerals 14 and 15 each designate a p-channel MOSFET, and 16 and 17 each designate an n-channel MOSFET, both of which have a low threshold voltage (absolute value). The reference numeral 5 designates a p-channel MOSFET, and 6 designates an n-channel MOSFET, both of which have a high threshold voltage (absolute value). The MOSFETs 14–17 constitute a sequential circuit 20 having a pair of memory nodes 18 and 19, one of which is placed at a high level while the other of which is placed at a low level, thus keeping an input value.

Next, the operation will be described.

When the control signal CS1 is placed at the high level and the CSB1 is placed at the low level, the sequential circuit 20 operates normally and holds the written data correctly. In addition, since the threshold voltages of the p-channel MOSFETs 14 and 15, and the n-channel MOSFETs 16 and 17 are both low, high speed writing to and reading from the nodes 18 and 19 can be achieved.

On the other hand, when the sequential circuit 20 is set idling (sleeping) by placing the control signal CS1 at the low level and the CSB1 at the high level, the leakage current is reduced. This will corrupt the data of the nodes 18 and 19 because the leakage current of the MOSFETs 5 and 6 is lower than the leakage currents of the MOSFETs 14–17 in this case. More specifically, assuming that the node 18 is to be placed at the high level and the node 19 is to be placed at the low level, the p-channel MOSFET 15 and n-channel MOSFET 16 of the four MOSFETs 14–17 must be turned off and the remaining two must conduct. However, the high level of the node 18 falls and the low level of the node 19 rises owing to the leakage current flowing through the p-channel MOSFET 15 and n-channel MOSFET 16. This continues until the levels of the nodes 18 and 19 becomes equal, and hence the data to be held is lost. Thus, the conventional low operating voltage semiconductor integrated circuit has a problem in that the data of the sequential circuit is eliminated.

SUMMARY OF THE INVENTION

The present invention is implemented to solve the foregoing problem. It is therefore an object of the present invention to provide a semiconductor integrated circuit capable of saving power by reducing the leakage current of a circuit in an idling (sleeping) mode without corrupting data held in the sequential circuit.

According to a first aspect of the present invention, there is provided a semiconductor integrated circuit comprising: a combination circuit; switching means connected to the combination circuit for switching power supply to the combination circuit; a sequential circuit including first field effect transistors; and control means for varying a threshold voltage of the first field effect transistors.

Here, each of the first field effect transistors included in the sequential circuit may comprise a back gate, and the control means may vary the threshold voltage of the first field effect transistors through the back gate.

The control means may comprise a positive voltage generator for generating a positive voltage to be applied to the back gate of each of a first group of the first field effect transistors whose sources are connected to a supply voltage, and a negative voltage generator for generating a negative voltage to be applied to the back gate of each of a second group of the first field effect transistors whose sources are connected to ground.

The combination circuit may comprise second field effect transistors, and the switching means may comprise third field effect transistors, and the third field effect transistors may have a threshold voltage whose absolute value is greater than an absolute value of a threshold voltage of the second field effect transistors.

The combination circuit may comprise second field effect transistors, and the switching means may comprise at least two third field effect transistors, a first one of the third field effect transistors having its source connected to a supply voltage and a second one of the third field effect transistors having its source connected to a ground potential, and the third field effect transistors may have a threshold voltage whose absolute value is substantially equal to an absolute value of a threshold voltage of the second field effect transistors, and the first one of the third field effect transistors and second one of the third field effect transistors may have their gate-source voltages reversely biased while the third field effect transistors are placed in a nonconducting state.

The combination circuit may comprise a plurality of first circuit blocks each connected to different switching means for independently switching power supply to the first circuit blocks, and the sequential circuit may comprise a plurality of second circuit blocks each connected to different control means for varying a threshold voltage of first field effect transistors included in each of the second circuit blocks.

The switching means may comprise a first booster for generating a voltage higher than a supply voltage, a first debooster for generating a voltage lower than a ground potential, inverting means connected to the first booster for inverting an output of the first booster, and noninverting means connected to the first debooster for noninverting an output of the first debooster.

The control means may comprise a second booster connected to the positive voltage generator and a second debooster connected to the negative voltage generator, and the positive voltage generator may comprise a multiplexer for selecting one of an output of the second booster and a supply voltage, and the negative voltage generator may comprise a multiplexer for selecting one of an output of the second debooster and a ground potential.

The switching means may comprise a first booster for generating a voltage higher than a supply voltage, and a first debooster for generating a voltage lower than a ground potential, and the second booster and the second debooster included in the control means may differ from the first booster and the first debooster included in the switching means, respectively.

According to a second aspect of the present invention, there is provided a semiconductor integrated circuit comprising: a logic circuit including a combination circuit and a sequential circuit; an integrated circuit including a booster and a debooster; switching means for switching power supply to the combination circuit; field effect transistors included in the sequential circuit, the field effect transistors each having a back gate; and control means for controlling the switching means and the field effect transistors utilizing the booster and the debooster, the control means controlling the field effect transistors through their back gates.

Here, the integrated circuit including the booster and the debooster may be a dynamic random access memory.

DETAILED DESCRIPTION OF THE PREFERRED EMBODIMENTS

The invention will now be described with reference to the accompanying drawings.

Embodiment 1

Figure 1:
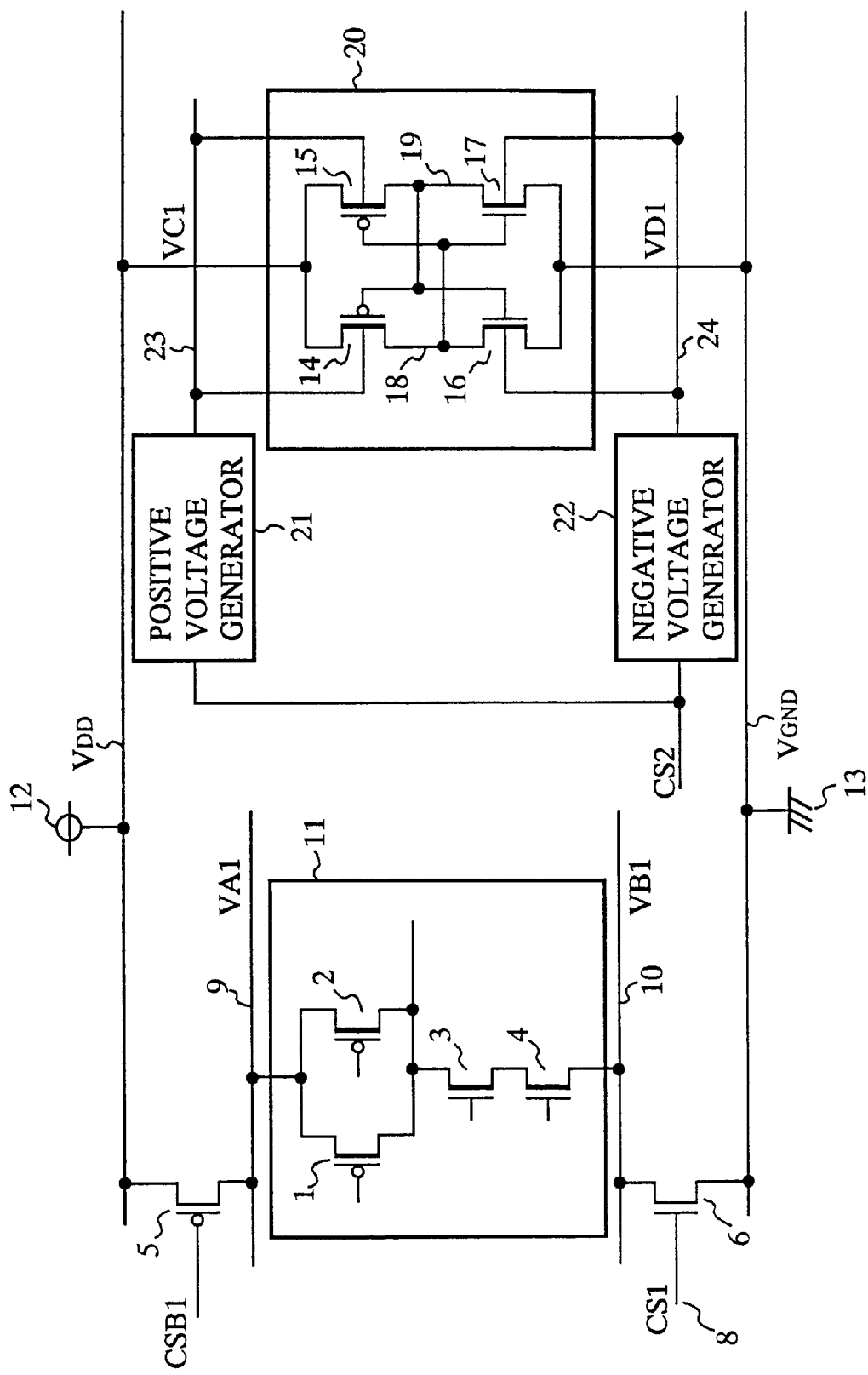
FIG. 1 is a circuit diagram showing the configuration of an embodiment 1 of a semiconductor integrated circuit in accordance with the present invention.

FIG. 1 is a circuit diagram showing an embodiment 1 of a low operating voltage semiconductor integrated circuit in accordance with the present invention. In this figure, the reference numerals 1, 2 and 5 each designate a p-channel MOSFET, and 3, 4 and 6 each designate an n-channel MOSFET. The absolute value of the threshold voltage of the p-channel MOSFETs 1 and 2 are set lower than that of the p-channel MOSFET 5, and the absolute value of the threshold voltage of the n-channel MOSFETs 3 and 4 are set lower than that of the n-channel MOSFET 6 (in the following description, the term "threshold voltage" refers to its absolute value). The MOSFETs 1–4 constitute a combination circuit 11 like a two input NAND gate, for example, and the MOSFETs 5 and 6 constitute a switching means. The p-channel MOSFET 5 is connected across a supply voltage 12 and a virtual power supply line 9 with its gate receiving a control signal CSB1, and the n-channel MOSFET 6 is connected across a ground line 10 and a ground 13 with its gate receiving a control signal CS1.

On the other hand, the reference numerals 14 and 15 each designate a p-channel MOSFET, and 16 and 17 each designate an n-channel MOSFET, which constitute a sequential circuit 20. A positive voltage generator 21, a negative voltage generator 22 and back gate nodes 23 and 24 constitute a control means. The MOSFETs 14–17 have a low threshold voltage (absolute value), forming a pair of memory nodes 18 and 19. The back gate potential VC1 of the p-channel MOSFETs 14 and 15 are connected to the output of the positive voltage generator 21, and the back gate potential VD1 of the n-channel MOSFETs 16 and 17 are connected to the output of the negative voltage generator 22.

Next, the operation will be described.

To operate the combination circuit 11, the control signal CS1 is placed at a high level, and its inverted signal, the control signal CSB1 is placed at a low level. Thus, both the p-channel MOSFET 5 and n-channel MOSFET 6 conduct, so that the virtual power supply line 9 is pulled up to a voltage $V_{DD}$ of the supply voltage 12, and the ground line 10 is pulled down to the voltage $V_{GND}$ of the ground voltage 13. As a result, the combination circuit 11 performs the normal NAND operation. In this case, since the threshold voltages (absolute value) of the MOSFETs 1–4 are set low, high speed operation is achieved even if the voltage $V_{DD}$ of the supply voltage 12 is low.

On the other hand, when the combination circuit 11 is idling, the control signal CS1 is placed at the low level, and its inverted signal, the control signal CSB1 is placed at the high level. This will cause both the p-channel MOSFET 5 and n-channel MOSFET 6 to be placed at a nonconducting state so that the virtual power supply line 9 and ground line 10 are disconnected from the supply voltage 12 and ground 13, respectively. In this case, since the threshold voltages (absolute value) of the p-channel MOSFET 5 and n-channel MOSFET 6 have been set higher than those of the MOSFET 1–4, the leakage current can be suppressed to a small value.

On the other hand, when the sequential circuit 20 operates, the control signal CS2 input to the control means is placed at a high level so that the positive voltage generator 21 places the back gate potential VC1 of the p-channel MOSFETs 14 and 15 at the supply voltage $V_{DD}$, and the negative voltage generator 22 places the back gate potential VD1 of the n-channel MOSFETs 16 and 17 at the ground potential $V_{GND}$. Accordingly, the sequential circuit 20 can achieve a normal memory operation. In addition, since the threshold voltages of the p-channel MOSFETs 14 and 15, and the n-channel MOSFETs 16 and 17 are both low, high speed data writing to and reading from the nodes 18 and 19 can be achieved.

In contrast, to set the sequential circuit 20 at an idling mode, the control signal CS2 is placed at a low level. This will place the output voltage VC1 of the positive voltage generator 21 at a level higher than the supply voltage $V_{DD}$, and the output voltage VD1 of the negative voltage generator 22 at a level lower than the ground potential $V_{GND}$. As a result, the back gate potential VC1 of the p-channel MOSFETs 14 and 15 becomes higher than the voltage of the supply voltage 12, thereby increasing their threshold voltage. Likewise, the back gate potential VD1 of the n-channel MOSFETs 16 and 17 becomes lower than the voltage of the ground 13, thereby increasing their threshold voltage. Thus, the leakage current flowing from the supply voltage 12 to the ground 13 can be reduced.

As described above, according to the embodiment 1, when the sequential circuit 20 is idling, the threshold voltages of the low threshold MOSFETs are raised by controlling their back gate potentials. This has an advantage of saving power by reducing the leakage current without corrupting the data of the memory nodes. In addition, since the combination circuit 11 and sequential circuit 20 employ low threshold MOSFETs, they can achieve high speed writing and reading with low consumed power in the operating mode. Although the embodiment 1 is described on the assumption that the two separate control signals CS1 and CS2 are used, they can share the same control signal, achieving a similar effect and advantage.

Embodiment 2

Figure 2:
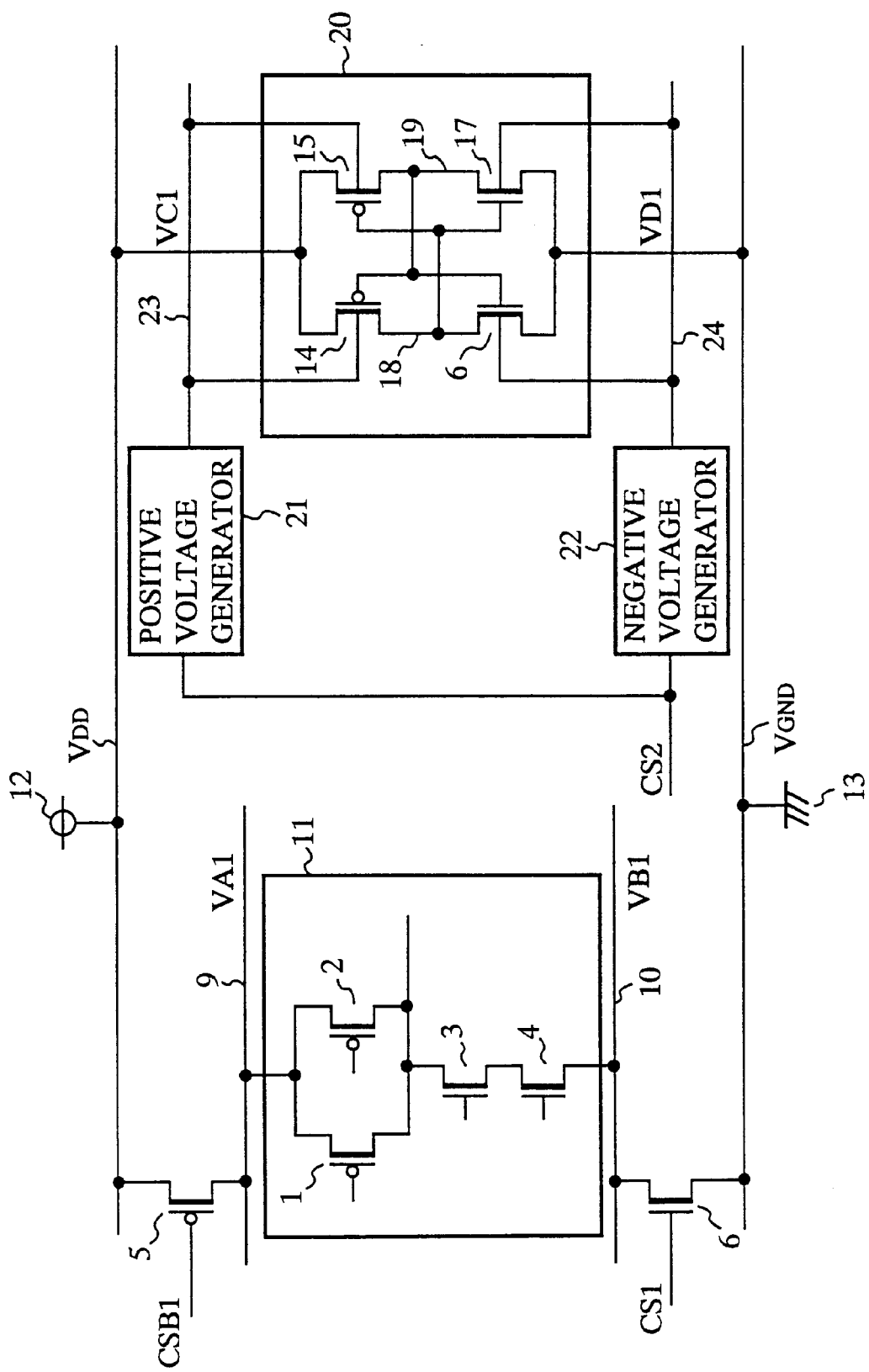
FIG. 2 is a circuit diagram showing the configuration of an embodiment 2 of the semiconductor integrated circuit in accordance with the present invention.

FIG. 2 is a circuit diagram showing an embodiment 2 of a low operating voltage semiconductor integrated circuit in accordance with the present invention. In this figure, since the configuration and operation of the sequential circuit 20 are the same as those of the embodiment 1, a duplicate description will be omitted here by designating the same portions by the same reference numerals. In the embodiment 2, the MOSFETs 5 and 6 for suppressing the leakage current are designed to have a low threshold voltage as the other MOSFETs 1–4.

Next, the operation will be described.

In the embodiment 2, while the combination circuit 11 is in the idling mode, the control signal CS1 is placed at a potential lower than the ground voltage $V_{GND}$, and the control signal CSB1 is placed at a potential higher than the supply voltage $V_{DD}$, to reduce the leakage current. Otherwise, the total consumption power of the whole circuit would increase owing to the leakage current flowing across the power supply and ground because the threshold voltages of the MOSFETs 5 and 6 constituting a switching means are nearly the same as those of the MOSFETs 1–4 constituting the combination circuit 11. The thus arranged circuit of this embodiment not only offers an advantage similar to that of the embodiment 1 without using the MOSFETs of different threshold voltages, but also enables the MOSFETs 5 and 6 employed as the switching means to have a low threshold voltage as the other MOSFETs. As a result, the number of masks can be reduced in the fabrication process of the semiconductor integrated circuits, which in turn makes it possible to reduce the process steps and cost.

Embodiment 3

Figure 3:
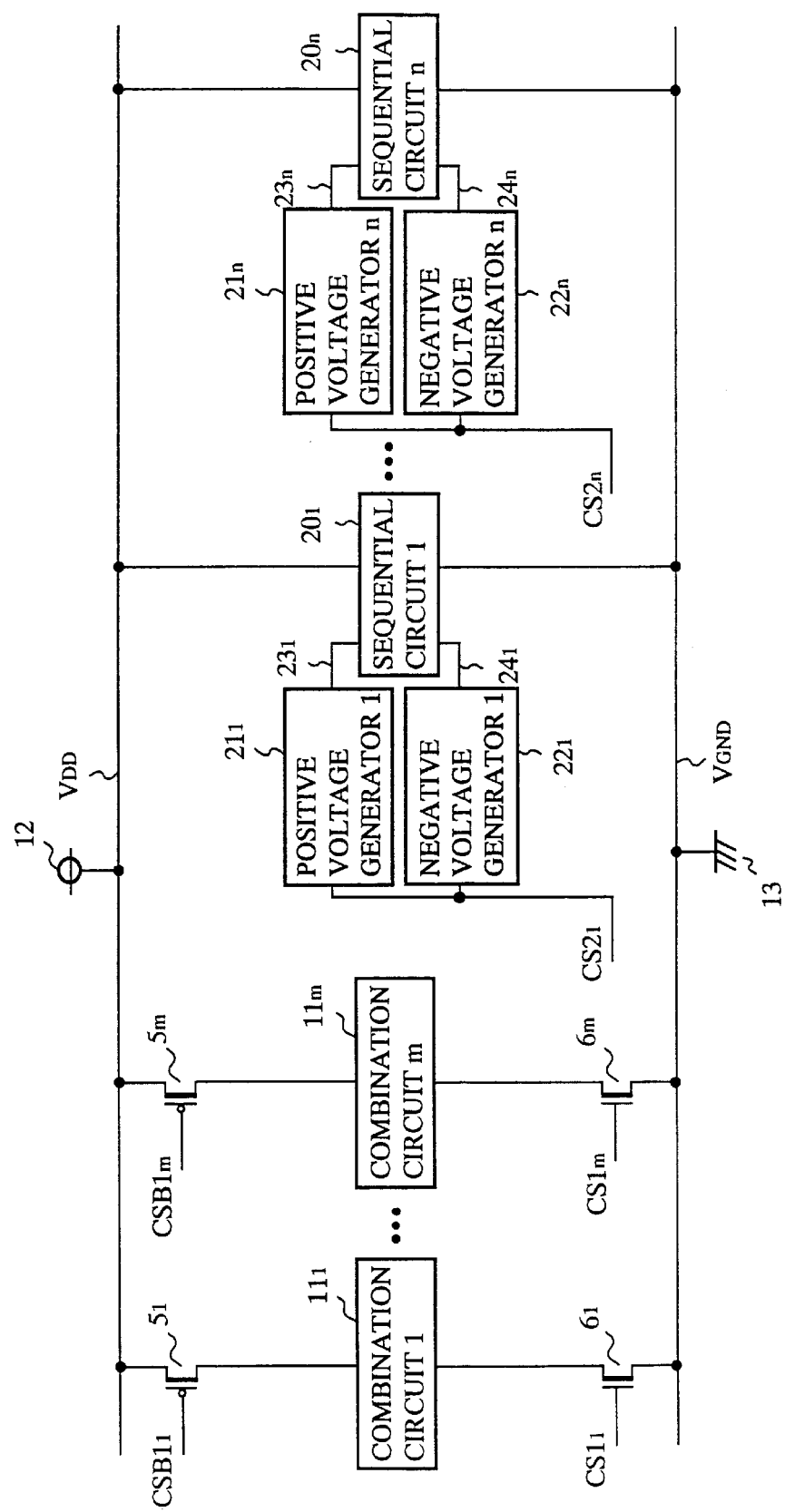
FIG. 3 is a circuit diagram showing the configuration of an embodiment 3 of the semiconductor integrated circuit in accordance with the present invention.

FIG. 3 is a block diagram showing an embodiment 3 in accordance with the present invention, in which a plurality of circuit blocks each consisting of a combination circuit or a sequential circuit are applied to a large scale integration (LSI) circuit. In this figure, the reference numerals $11_1$–$11_m$ designate combination circuit blocks which are connected to p-channel MOSFETs $5_1$–$5_m$ receiving control signals $CSB1_1$–$CSB1_m$, and n-channel MOSFETs $6_1$–$6_m$ receiving control signals $CS1_1$–$CS1_m$, respectively. On the other hand, the reference numerals $20_1$–$20_n$ designate sequential circuit blocks having their backgate nodes (a control means) $23_1$–$23_n$ and $24_1$–$24_n$ connected to positive voltage generators $21_1$–$21_n$ and negative voltage generators $22_1$–$22_n$, to which control signals $CS2_1$–$CS2_n$ are input, respectively. Since the remaining structure is the same as that of the embodiment 2 as shown in FIG. 2, a duplicate description will be omitted here by attaching the same reference numerals to the same portions.

Regarding the combination circuit blocks $11_1$–$11_m$, the p-channel MOSFETs $5_1$–$5_m$ have a low threshold voltage so that they operate in the same fashion as the p-channel MOSFET 5 in the embodiment 2 under the control of the control signals $CSB1_1$–$CSB1_m$. Likewise, the n-channel MOSFETs $6_1$–$6_m$ have a low threshold voltage so that they operate in the same fashion as the n-channel MOSFET 6 in the embodiment 2 under the control of the control signals $CS1_1$–$CS1_m$. In addition, the positive voltage generators $21_1$–$21_n$ operates in a manner similar to the positive voltage generator 21 in the embodiment 1 so that they each control the back gate nodes $23_1$–$23_n$ of the p-channel MOSFETs of the sequential circuits $20_1$–$20_n$ by the control signals $CS2_1$–$CS2_n$. Likewise, the negative voltage generators $22_1$–$22_n$ also operates in a manner similar to the negative voltage generator 22 in the embodiment 1 so that they each control the back gate nodes $24_1$–$24_n$ of the n-channel MOSFETs of the sequential circuits $20_1$–$20_n$ by the control signals $CS2_1$–$CS2_n$. Here, it is assumed that the control signals $CSB1_1$–$CSB1_m$, $CS1_1$–$CS1_m$ and $CS2_1$–$CS2_n$ can operate independently.

Next the operation will be described.

The combination circuit blocks $11_1$–$11_m$ operate independently of each other by inputting the control signals $CSB1_1$–$CSB1_m$ and $CS1_1$–$CS1_m$. Likewise, the sequential circuits $20_1$–$20_n$ operate independently of each other by inputting the control signals $CS2_1$–$CS2_n$.

Thus, according to the embodiment 3, since the sequential circuit can be controlled block by block independently while it is in the idling mode, the leakage current can be controlled to be reduced individually without corrupting the data held by the memory nodes. In addition, employing the MOSFETs with the same threshold voltage can reduce the number of process steps because of the reduction in the number of masks. Thus, advantages can be gained of reducing fabrication cost, and of power saving due to reduction in the leakage current while the semiconductor integrated circuit is standing by. Incidentally, although the embodiment 3 is described here in connection with the semiconductor integrated circuit of the embodiment 2, it can also be based on that of the embodiment 1.

Embodiment 4

Figure 4:
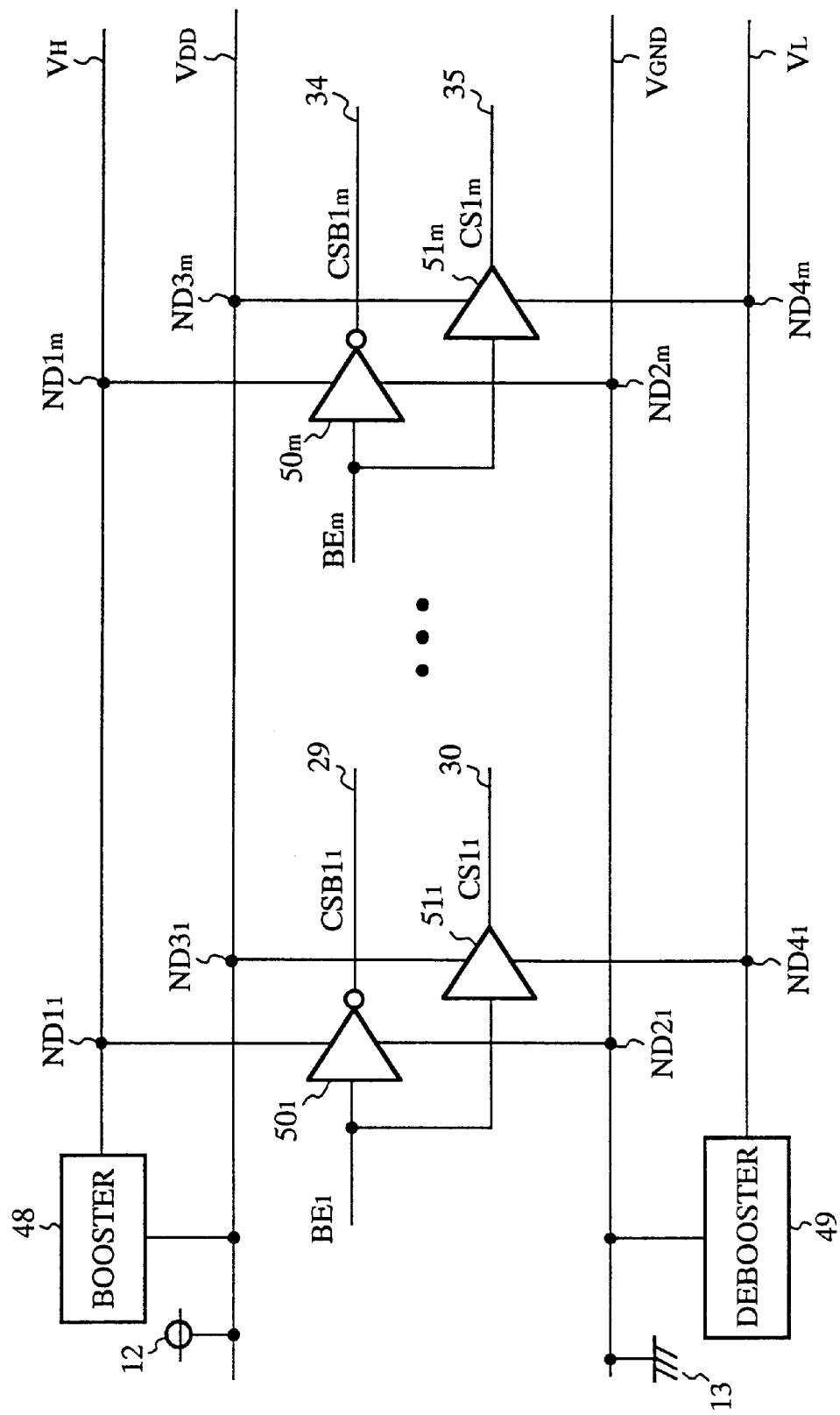
FIG. 4 is a circuit diagram showing the configuration of a switching means of an embodiment 4 of the semiconductor integrated circuit in accordance with the present invention.

FIG. 4 is a circuit diagram showing a switching means of an embodiment 4 of the semiconductor integrated circuit in accordance with the present invention, which generates the control signals $CSB1_1$–$CSB1_m$ and $CS1_1$–$CS1_m$ using a booster and a debooster. In FIG. 4, the reference numeral 48 designates a booster (first booster) for generating a voltage higher than the supply voltage, 49 designates a debooster (first debooster) for generating a voltage lower than the ground potential, $50_1$–$50_m$ each designate a buffer circuit for inverting control signals $BE_1$–$BE_M$, and $51_1$–$51_m$ each designate a buffer circuit for noninverting the control signals $BE_1$–$BE_m$. The buffer circuits $50_1$–$50_m$ and noninverting buffer circuits $51_1$–$51_m$ constitute an inverting means and noninverting means, respectively. The reference symbol $V_H$ designates the output of the booster 48, that generates a potential higher than the supply voltage $V_{DD}$, and $V_L$ designates the output of the debooster 49 that generates a potential lower than the ground potential $V_{GND}$. The inverting buffer circuits $50_1$–$50_m$ have their power supply ports and ground ports connected to nodes $ND1_1$ and $ND2_1$, ..., and nodes $ND1_m$–$ND2_m$, respectively. Likewise, the noninverting buffer circuits $51_1$–$51_m$ have their power supply ports and ground ports connected to nodes $ND3_1$ and $ND4_1$, ..., and nodes $ND3_m$–$ND4_m$, respectively. The control signals $BE_1$–$BE_m$ are signals for controlling the control signals $CSB1_1$ and $CS1_1$, ..., and $CSB1_m$ and $CS1_m$. Since the remaining portions are the same as those of the embodiment 3, a duplicate description will be omitted by designating the corresponding portions by the same reference numerals.

Next, the operation will be described.

Taking the combination circuit block $11_1$, one of the m combination circuit blocks as shown in FIG. 3, for example, the control signal $BE_1$ is placed at a high level when the combination circuit block operates. In this case, the control signals $CSB1_1$ and $CS1_1$ are converted into the ground potential $V_{GND}$ and supply voltage $V_{DD}$ through the buffer circuits $50_1$ and $51_1$, respectively, so that the combination circuit block $11_1$ operates as in the embodiment 3. On the other hand, while the combination circuit block $11_1$ is idling, the control signal $BE_1$ is placed at the low level so that the control signal $CSB1_1$ is converted through the noninverting buffer $50_1$ to the potential $V_H$ of the node $ND1_1$ having a higher potential than the supply voltage $V_{DD}$ and at the same time the control signal $CS1_1$ is converted through the noninverting buffer $51_1$ to the potential $V_L$ of the node $ND4_1$ having a lower potential than the ground potential. This enables the combination circuit block $11_1$ to reduce its leakage current as in the embodiment 3. The buffer circuits $50_m$ and $51_m$ operate in the same manner by the control signal $BE_m$.

Thus, according to the embodiment 4, adding simple circuits such as the inverting buffer circuit and noninverting buffer circuit besides the booster and debooster enables the combination circuits to further reduce the leakage currents while they are idling. This offers an advantage of further reducing consumed power due to the leakage currents in idling portions in the semiconductor integrated circuit. In the present embodiment 4, the circuit consisting of the combination circuits and sequential circuits as shown in the embodiment 3 can be integrated into the same chip with the booster and debooster, which has an advantage of reducing the size of a chip in which the semiconductor integrated circuit is embedded.

Embodiment 5

Figure 5:
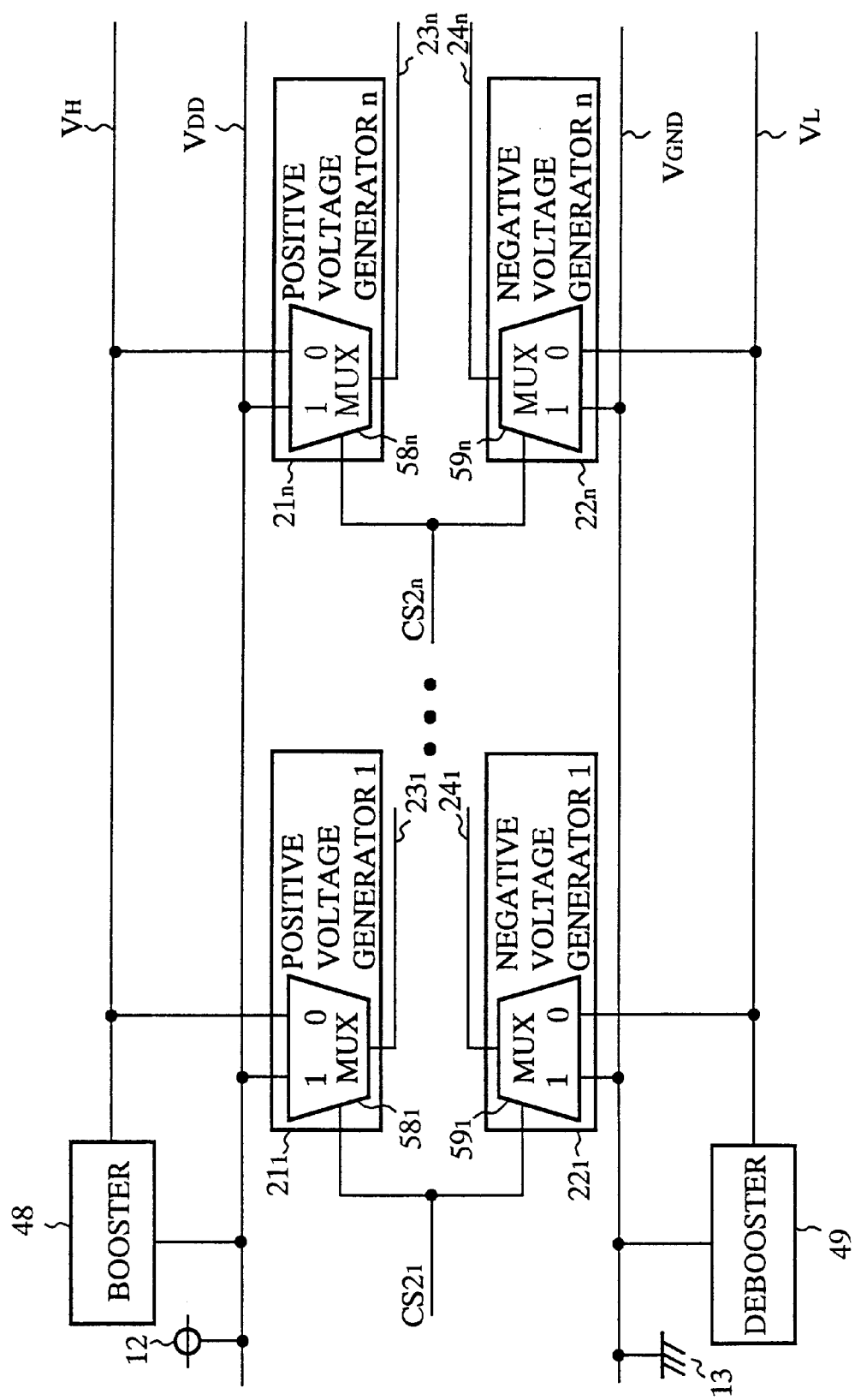
FIG. 5 is a circuit diagram showing the configuration of a control means of an embodiment 5 of the semiconductor integrated circuit in accordance with the present invention.

FIG. 5 is a circuit diagram showing a control means of an embodiment 5 of the semiconductor integrated circuit in accordance with the present invention. In this figure, the reference numerals $58_1$–$58_n$ designate multiplexers (MUXs) constituting positive voltage generators $21_1$–$21_n$, respectively, and the reference numerals $59_1$–$59_n$ designate multiplexers (MUXs) constituting negative voltage generators $22_1$–$22_n$. Since the remaining portions are the same as those of the embodiment 4, a duplicate description will be omitted here by designating the corresponding portions by the same reference numerals.

Next, the operation will be described.

Taking the sequential circuit $20_1$ as shown in FIG. 3 for example, the control signal $CS2_1$ is placed at a high level while the sequential circuit $20_1$ operates so that the multiplexer $58_1$ selects the supply voltage $V_{DD}$ and supplies it to the back gate node $23_1$, and the multiplexer $59_1$ selects the ground potential $V_{GND}$ and supplies it to the back gate node $24_1$. On the other hand, the control signal $CS2_1$ is placed at the low level while the sequential circuit $20_1$ is idling so that the multiplexer $58_1$ selects the potential $V_H$ higher than the supply voltage and supplies it to the back gate node $23_1$, and the multiplexer $59_1$ selects the potential $V_L$ lower than the ground potential and supplies it to the back gate node $24_1$. This will implement the same operation as in the embodiment 3.

Thus, in the embodiment 5, simple, inexpensive multiplexers are applied to the positive and negative voltage generators. This enables the leakage currents to be reduced even when the sequential circuit is idling without corrupting the data held in the sequential circuit. In addition, this will offer an advantage of reducing consumed power in the idling portions of the semiconductor integrated circuit at low fabrication cost. Although the booster (second booster) 48 and debooster (second debooster) 49 are described as the same ones in the embodiment 4, they can be altered to independently set their output voltages. This will make it possible to implement more strict control to reduce the leakage currents. In addition, the circuit consisting of the combination circuit and sequential circuit as shown in the embodiment 3 can be integrated into a single chip with the positive and negative voltage generators described in the present embodiment 5, which has an advantage of reducing the size of the chip in which the semiconductor integrated circuit is embedded.

Embodiment 6

Figure 6:
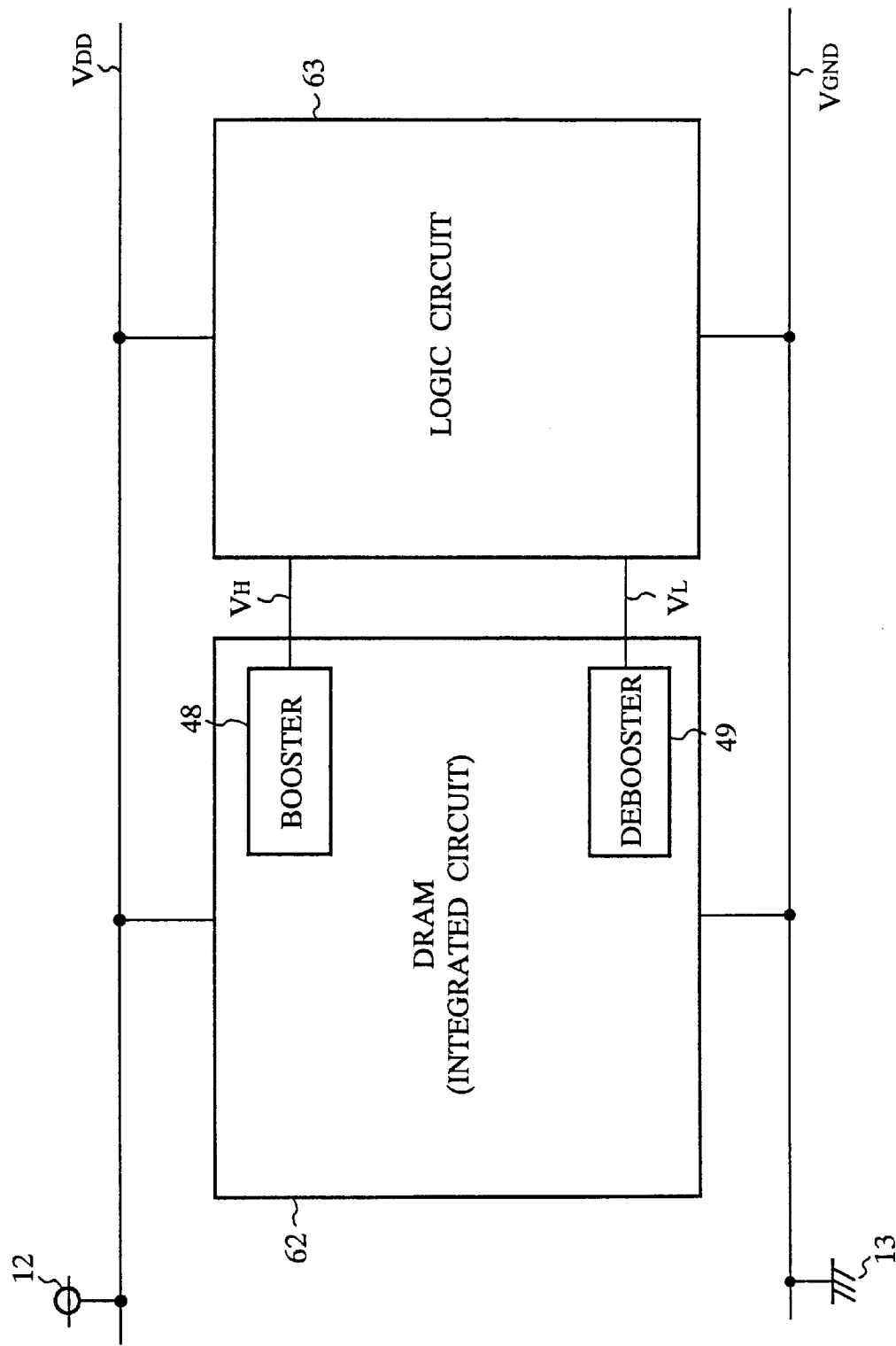
FIG. 6 is a circuit diagram showing the configuration of an embodiment 6 of the semiconductor integrated circuit in accordance with the present invention.
Figure 7:
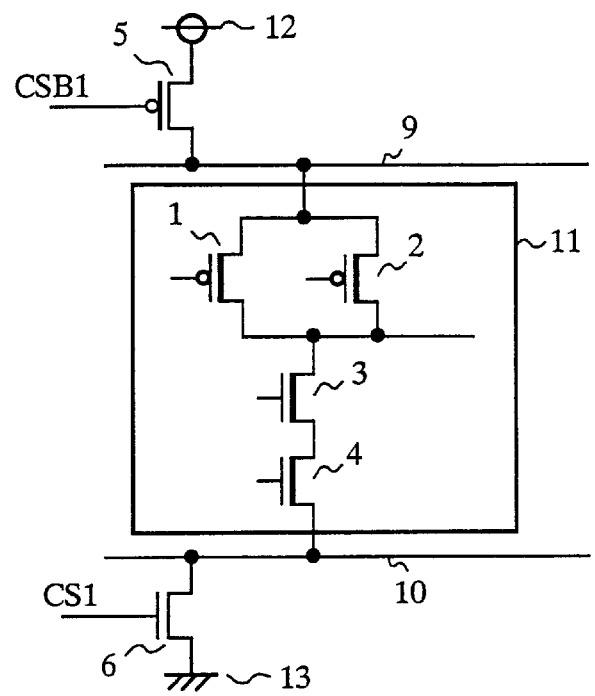
FIG. 7 is a circuit diagram showing a conventional low operating voltage circuit employing MT-CMOS.
Figure 8:
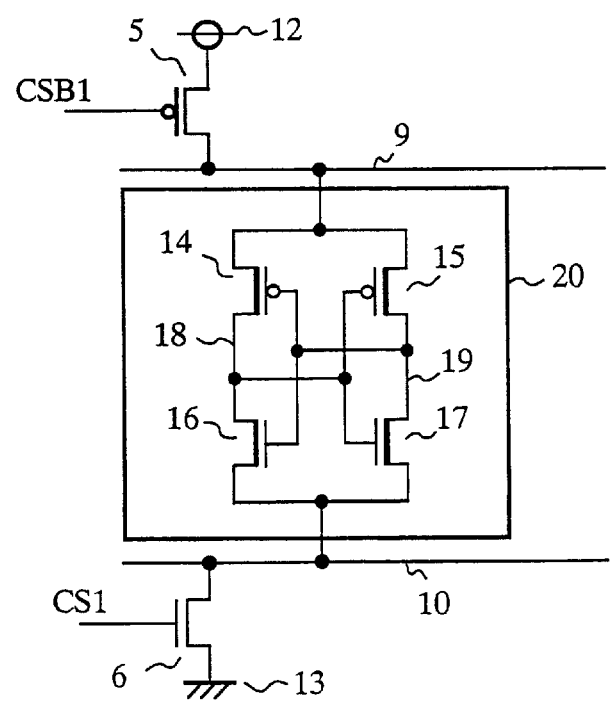
FIG. 8 is a circuit diagram showing a conventional latch circuit.

FIG. 6 is a circuit diagram showing an embodiment 6 of the semiconductor integrated circuit in accordance with the present invention. In this figure, the reference numeral 62 designates a large scale integration MOSRAM whose memory information must be refreshed, such as flash memory, dynamic random access memory (DRAM) or the like, and 63 designates a logic circuit, a so-called hybrid semiconductor integrated circuit in which a memory portion and logic portion are mixed. The logic circuit has the same structure as the that of the embodiment 3 consisting of the combination circuit and sequential circuit. The large scale integration MOSRAM includes a booster 48 and a debooster 49 to achieve good operation such as refreshing, and applying their outputs $V_H$ and $V_L$ to the logic circuit 63 makes it possible to implement the operation as in the embodiment 3.

Thus, according to the embodiment 6, the booster and debooster included in the DRAM can be effectively utilized, which can reduce the occupying area of an additional circuit and the number of components of the hardware. As a result, this contributes to the reduction not only of the power consumption due to the leakage current in the idling portions of the semiconductor integrated circuit, but also of the chip size of the semiconductor integrated circuit, thereby offering an advantage of reducing the fabrication cost.

What is claimed is:

1. A semiconductor integrated circuit comprising:

a first voltage supply line for supplying a first voltage;

a second voltage supply line for supplying a second voltage;

a combination circuit, connected to said second voltage supply line, including at least one first field effect transistor;

a sequential circuit including a latch circuit connected between said first voltage supply line and said second voltage supply line, said latch circuit including second field effect transistors;

a third field effect transistor connected between said combination circuit and said first voltage supply line, for controlling supply of said first voltage to said combination circuit in response to a control signal; and control means, having a first voltage generator for generating a third voltage, for selectively supplying said first voltage and the third voltage to each backgate electrode of a first group of said second field effect transistors in response to said control signal, said third voltage being biased from said first voltage so that an absolute value of each threshold voltage of the first group of said second field effect transistors increases.

2. The semiconductor integrated circuit as claimed in claim 1, wherein each of said first group of the second field effect transistors is an n-type field effect transistor and said third voltage is lower than said first voltage, wherein said control means further comprises a second voltage generator for generating a fourth voltage higher than said second voltage, said control means applies said second voltage to each backgate electrode of a second group of said second field effect transistors when said first voltage is supplied to each backgate electrode of the first group and supplies said fourth voltage to each backgate electrode of the second group when said third voltage is supplied to each backgate electrode of the first group, and each of said second group of said second field effect transistors is a p-type field effect transistor.

3. The semiconductor integrated circuit as claimed in claim 1, wherein each of said first group of the second field effect transistors is a p-type field effect transistor and said third voltage is higher than said first voltage, wherein said control means comprises a second voltage generator for generating a fourth voltage lower than said second voltage, said control means supplies said second voltage to each backgate electrode of a second group of said second field effect transistors when said first voltage is supplied to each backgate electrode of the first group and supplies said fourth voltage to each backgate electrode of said second group when said third voltage is supplied to each backgate electrode of the first group, and each of said second group of second field effect transistors is an n-type field effect transistor.

4. The semiconductor integrated circuit as claimed in claim 1, wherein said third field effect transistor has a threshold voltage whose absolute value is greater than the absolute value of the threshold voltage of said first field effect transistor.

5. The semiconductor integrated circuit as claimed in claim 2, wherein said third field effect transistor has a threshold voltage whose absolute value is greater than the absolute value of the threshold voltage of said first field effect transistor.

6. The semiconductor integrated circuit as claimed in claim 3, wherein said third field effect transistor has a threshold voltage whose absolute value is greater than the absolute value of the threshold voltage of said first field effect transistor.

7. The semiconductor integrated circuit as claimed in claim 1, wherein said third field effect transistor has a threshold voltage whose absolute value is substantially equal to the absolute value of the threshold voltage of said first field effect transistor and wherein the gate voltage of the third field effect transistor at its turning off state is adversely biased against its source voltage compared with its turning on state.

8. The semiconductor integrated circuit as claimed in claim 2, wherein said third field effect transistor has a threshold voltage whose absolute value is substantially equal to the absolute value of the threshold voltage of said first field effect transistor and wherein the gate voltage of the third field effect transistor at its turning off state is adversely biased against its source voltage compared with its turning on state.

9. The semiconductor integrated circuit as claimed in claim 3, wherein said third field effect transistor has a threshold voltage whose absolute value is substantially equal to an absolute value of a threshold voltage of said first field effect transistor, wherein the gate voltage of the third field effect transistor at its turning off state is adversely biased against its source voltage compared with its turning on state.

10. A semiconductor integrated circuit comprising:

voltage supply lines for supplying a first voltage;

combination circuits including a plurality of first circuit blocks;

sequential circuits including a plurality of second circuit blocks each comprising a latch circuit, said latch circuit of each of said second circuit blocks being connected to said voltage supply lines and including a first field effect transistor;

a plurality of second field effect transistors provided corresponding to said plurality of the first circuit blocks, each connected between said voltage supply lines and the corresponding first circuit block and being rendered selectively conductive or non-conductive; and control means for selectively supplying said first voltage and a second voltage to a backgate electrode of said first field effect transistor of each second circuit block, said second voltage being a biased voltage from said first voltage in such a manner that the absolute value of the threshold voltage of said first field effect transistor of each second circuit block increases, when said second voltage is imposed to the backgate of the first field effect transistor;

wherein said plurality of second field effect transistors and said control means are controlled by a control signal.

11. The semiconductor integrated circuit as claimed in claim 10, further comprising:

a booster for generating a third voltage higher than said first voltage, and a buffer connected to said booster, for outputting a logical signal to a gate of each of said second field effect transistors in response to the control signal, a high level voltage of the logical signal being said third voltage generated in said booster, wherein said second field effect transistors are p-type field effect transistors.

12. The semiconductor integrated circuit as claimed in claim 10, further comprising:

a debooster for generating a third voltage lower than said first voltage, and a buffer connected to said debooster, for outputting a logical signal to a gate of each of said second field effect transistors in response to the control signal, a high level voltage of the logical signal being said third voltage generated in said debooster, wherein said second field effect transistors are n-type field effect transistors.

13. A semiconductor integrated circuit comprising;

power supply lines;

a combination circuit;

a sequential circuit including a latch circuit connected with the power supply lines, said latch circuit including first field effect transistors;

a switching means, arranged between the power supply lines and the combination circuit, for switching power supply to said combination circuit in response to a control signal;

control means for varying a threshold voltage of said first field effect transistors, wherein each of said first field effect transistors included in said sequential circuit comprises a backgate, and said control means varies the threshold voltage of said first field effect transistors through said backgate, wherein said control means comprises a positive voltage generator for generating a positive voltage to be applied to the backgate of each of a first group of said first field effect transistors whose sources are connected to a supply voltage, and a negative voltage generator for generating a negative voltage to be applied to the back gate of each of a second group of said first field effect transistors whose sources are connected to a ground, and wherein said control means comprises a second booster connected to said positive voltage generator and a second debooster connected to said negative voltage generator, and wherein said positive voltage generator comprises a multiplexer responsive to said control signal for selecting one of an output of said second booster and a supply voltage, and said voltage generator comprises a multiplexer for selecting one of an output of said second debooster and a ground potential.

14. The semiconductor integrated circuit as claimed in claim 13, wherein said switching means comprises a first booster for generating a voltage higher than a supply voltage, and a first debooster for generating a voltage lower than a ground potential, and wherein said second booster and said second debooster included in said control means differ from said first booster and said first debooster included in said switching means, respectively.

15. A semiconductor integrated circuit comprising:

power supply lines;

a logic circuit including a combination circuit and a sequential circuit, said combination circuit having a first field effect transistor and said sequential circuit comprising a latch circuit having second field effect transistors, said latch circuit of said sequential circuit being connected with the power supply lines;

a switching means, arranged between the power supply lines and the combination circuit, for switching power supply to a conductive electrode of said first field effect transistor of said combination circuit in response to a control signal;

an integrated circuit including a booster and a debooster; and control means for controlling said switching means and said second field effect transistors utilizing said booster and said debooster in response to said control signal, said control means controlling said second field effect transistors through backgates of said second field effect transistors.

16. A semiconductor integrated circuit comprising:

power supply lines;

a logic circuit including a combination circuit and a sequential circuit, said sequential circuit including a latch circuit and said sequential circuit being connected with the power supply lines;

an integrated circuit including a booster and a debooster;

switching means, arranged between the power supply lines and the combination circuit, for switching power supply to said combination circuit;

field effect transistors included in said sequential circuit, said field effect transistors each having a back gate;

control means for controlling said switching means and said field effect transistors utilizing said booster and said debooster in response to a control signal, said control means controlling said field effect transistors through their back gates; and wherein said integrated circuit including said booster and said debooster is a dynamic random access memory.

17. The semiconductor integrated circuit of claim 1, wherein said latch circuit comprises:
- a first pair of field effect transistors connected in series source-to-drain between said first voltage supply line and said second voltage supply line;
- a second pair of field effect transistors connected in series source-to-drain between said first voltage supply line and said second voltage supply line, said second pair of field effect transistors being disposed in parallel to said first pair of field effect transistors;
- wherein a gate of each of said first pair of field effect transistors is connected to the source-to-drain connection between said second pair of field effect transistors and a gate of each of said second pair of field effect transistors is connected to the source-to-drain connection between said first pair of field effect transistors.

18. The semiconductor integrated circuit of claim 10, wherein said latch circuit comprises:
- a first pair of field effect transistors connected in series source-to-drain between said voltage supply lines;
- a second pair of field effect transistors connected in series source-to-drain between said voltage supply lines, said second pair of field effect transistors being disposed in parallel to said first pair of field effect transistors;
- wherein a gate of each of said first pair of field effect transistors is connected to the source-to-drain connection between said second pair of field effect transistors and a gate of each of said second pair of field effect transistors is connected to the source-to-drain connection between said first pair of field effect transistors.

19. The semiconductor integrated circuit of claim 13, wherein said latch circuit comprises:
- a first pair of field effect transistors connected in series source-to-drain between said power supply lines;
- a second pair of field effect transistors connected in series source-to-drain between said power supply lines, said second pair of field effect transistors being disposed in parallel to said first pair of field effect transistors;
- wherein a gate of each of said first pair of field effect transistors is connected to the source-to-drain connection between said second pair of field effect transistors and a gate of each of said second pair of field effect transistors is connected to the source-to-drain connection between said first pair of field effect transistors.

20. The semiconductor integrated circuit of claim 15, wherein said latch circuit comprises:
- a first pair of field effect transistors connected in series source-to-drain between said power supply lines;
- a second pair of field effect transistors connected in series source-to-drain between said power supply lines, said second pair of field effect transistors being disposed in parallel to said first pair of field effect transistors;
- wherein a gate of each of said first pair of field effect transistors is connected to the source-to-drain connection between said second pair of field effect transistors and a gate of each of said second pair of field effect transistors is connected to the source-to-drain connection between said first pair of field effect transistors.

* * * * *